US007655931B2

(12) United States Patent
Gupta

(10) Patent No.: US 7,655,931 B2
(45) Date of Patent: *Feb. 2, 2010

(54) TECHNIQUES FOR IMPROVING THE PERFORMANCE AND EXTENDING THE LIFETIME OF AN ION SOURCE WITH GAS MIXING

(75) Inventor: Atul Gupta, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 287 days.

This patent is subject to a terminal disclaimer.

(21) Appl. No.: 11/693,308

(22) Filed: Mar. 29, 2007

(65) Prior Publication Data

US 2008/0237496 A1    Oct. 2, 2008

(51) Int. Cl.
*G21K 5/10* (2006.01)
*H05B 31/26* (2006.01)
*H01J 27/26* (2006.01)
*H01J 37/317* (2006.01)

(52) U.S. Cl. ............... 250/492.21; 250/492.2; 250/423 R; 315/111.81; 315/111.91; 313/362.1

(58) Field of Classification Search ............ 250/492.1, 250/492.2, 492.21, 492.3; 315/111.81, 111.91, 315/111.01; 313/362.1, 231.01
See application file for complete search history.

(56) References Cited

U.S. PATENT DOCUMENTS 6,215,125 B1 * 4/2001 Chen et al. ............ 250/492.21

| | | | |
|---|---|---|---|
| 6,756,600 B2 * | 6/2004 | Ng et al. ................ 250/492.21 |
| 7,397,048 B2 * | 7/2008 | Singh et al. ............ 250/492.21 |
| 7,491,947 B2 * | 2/2009 | Cobb et al. ................. 250/426 |
| 7,586,109 B2 * | 9/2009 | Perel et al. ............. 250/492.21 |
| 2004/0107909 A1 | 6/2004 | Collins et al. |
| 2005/0181621 A1 | 8/2005 | Borland et al. |
| 2006/0063360 A1 | 3/2006 | Singh et al. |
| 2006/0119546 A1 * | 6/2006 | Otsuka et al. ................. 345/68 |
| 2008/0179545 A1 * | 7/2008 | Perel et al. ............. 250/492.21 |
| 2008/0237496 A1 * | 10/2008 | Gupta .................... 250/492.21 |
| 2009/0200494 A1 * | 8/2009 | Hatem et al. ........... 250/492.21 |

FOREIGN PATENT DOCUMENTS

| CA | 1227289 A | 9/1987 |
| EP | 0066288 A1 | 8/1982 |
| JP | 11354068 | 12/1999 |

* cited by examiner

*Primary Examiner*—Bernard E Souw

(57) ABSTRACT

Techniques improving the performance and extending the lifetime of an ion source with gas mixing are disclosed. In one particular exemplary embodiment, the techniques may be realized as a method for improving performance and extending lifetime of an ion source in an ion implanter. The method may comprise introducing a predetermined amount of dopant gas into an ion source chamber. The dopant gas may comprise a dopant species. The method may also comprise introducing a predetermined amount of diluent gas into the ion source chamber. The diluent gas may dilute the dopant gas to improve the performance and extend the lifetime of the ion source. The diluent gas may further comprise a co-species that is the same as the dopant species.

23 Claims, 5 Drawing Sheets

TECHNIQUES FOR IMPROVING THE PERFORMANCE AND EXTENDING THE LIFETIME OF AN ION SOURCE WITH GAS MIXING

FIELD OF THE DISCLOSURE

The present disclosure relates generally to semiconductor manufacturing equipment and, more particularly, to techniques for improving the performance and extending the lifetime of an ion source with gas mixing.

BACKGROUND OF THE DISCLOSURE

Ion implantation is a process of depositing chemical species into a substrate by direct bombardment of the substrate with energized ions. In semiconductor manufacturing, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energy levels.

FIG. 1 depicts a conventional ion implanter system 100. The ion implanter system 100 may comprise an ion source 102 and a complex series of components through which an ion beam 10 passes. The series of components may include, for example, an extraction manipulator 104, a filter magnet 106, an acceleration or deceleration column 108, an analyzer magnet 110, a rotating mass slit 112, a scanner 114, and a corrector magnet 116. Much like a series of optical lenses that manipulate a light beam, the ion implanter components can filter and focus the ion beam 10 before steering it towards an end station 120.

The end station 120 supports one or more workpieces, such as workpiece 122, in the path of ion beam 10 such that ions of the desired speciess are implanted into the workpiece 122. The workpiece 122 may be, for example, a semiconductor wafer or other similar target object requiring ion implantation. The end station 120 may also include a platen 124 to support the workpiece 122. The platen 124 may secure the workpiece 122 using electrostatic forces or other similar forces. The end station 120 may also include a mechanical workpiece scanner (not illustrated) for moving the workpiece 122 in a desired direction. The end station 120 may also include additional components, such as automated workpiece handling elements for introducing a workpiece 122 into the ion implanter system 100 and for removing the workpiece 122 after ion implantation. The ion implanter system 100 may also include a controller (not illustrated) to control a variety of subsystems and components of the ion implanter system 100. The ion implanter system 100 may also include a number of measurement devices, such as a dose control Faraday cup 118, a traveling Faraday cup 128, and a setup Faraday cup 126. These devices may be used to monitor and control the ion beam conditions. It should be appreciated by those skilled in the art that the entire path traversed by the ion beam 10 is typically evacuated during ion implantation.

The ion source 102 is a critical component of the ion implanter system 100. The ion source 102 is required to generate a stable, well-defined ion beam 10 for a variety of different ion species and extraction voltages. It is therefore desirable to operate the ion source 102 for extended periods of time without the need for maintenance or repair. Hence, the lifetime of the ion source 102 or mean time between failures (MTBF) is one performance criteria of the ion source 102 and a critical metric for the performance of an ion implanter system 100.

FIG. 2 depicts a typical embodiment of the ion source 102 in the ion implanter system 100. The ion source 102 may be an inductively heated cathode (IHC) ion source, which is typically used in high current ion implantation equipment. Other various ion sources may also be utilized. The ion source 102 includes an arc chamber housing 202 defining an arc chamber 206. The arc chamber housing 202 also includes an extraction aperture 204 for the ion beam 10. A cathode 208 and a repeller electrode 210 (or anticathode) may be positioned within the arc chamber 206. The repeller electrode 210 may be electrically isolated. A cathode insulator 212 may be positioned relative to the cathode 208 to electrically and thermally insulate the cathode 208 from the arc chamber housing 202. The cathode 208 may also be separated from the insulator 212 by a vacuum gap to control thermal conduction. A filament 214 may be positioned outside the arc chamber 206 and in close proximity to the cathode 208 to heat the cathode 208. A support rod 216 may support the cathode 208 and the filament 214. The cathode 208 may be positively biased relative to the filament 214 in order to accelerate electrons emitted from the filament 214 to the cathode 208. One or more source magnets 220 may also be provided to produce a magnetic field B within the arc chamber 206 in a direction toward the cathode 208 (see arrow 222 of FIG. 2).

An extraction electrode configuration, such as a ground electrode 240 and a suppression electrode 242, may be positioned in front of the extraction aperture 204. Each of the ground electrode 240 and the suppression electrode 242 have an aperture aligned with the extraction aperture 204 for extraction of the well-defined ion beam 10 from the arc chamber 206 for use in the ion implanter system 100.

An extraction power supply 248 may provide an extraction voltage between the arc chamber 206 and the ground electrode 240 for extraction of the ion beam 10 from the arc chamber 206. The extraction voltage may be adjusted according to the desired energy of the ion beam 10. A suppression power supply 246 may negatively bias the suppression electrode 242 relative to the ground electrode 240 in order to inhibit loss of electrons (from back-streaming to the ion source 102) within the ion beam 10. One or more additional power supplies may also be provided to the ion implanter system 100, such as a filament power supply or an arc power supply. A filament power supply (not illustrated) may provide current to the filament 214 for heating thereof, which in turn generates electrons that are accelerated toward the cathode 208 for heating the cathode 208. An arc power supply (not illustrated) may be coupled to the arc chamber housing 202 to facilitate emission of electrons from the cathode 208 into a plasma 20 formed within the arc chamber 206. This power may bias the cathode 208 to a negative potential relative to the arc chamber 202.

An ion source controller 250 provides control of the ion source 102. For example, the ion source controller 250 may control various power supplies of the ion source and/or may also control the flow rate of dopant gas from a dopant gas source 260 into the arc chamber 206. The ion source controller 250 may be a programmed controller or a dedicated special purpose controller. In one embodiment, the ion source controller 250 is incorporated into a main control computer of the ion implanter system 100.

A dopant gas source 260 may inject a predetermined amount of dopant gas into the arc chamber 206 via a gas flow controller 266. The dopant gas source 260 may provide a particular dopant gas containing a desired dopant element.

For example, the dopant element may include boron (B), germanium (Ge), phosphorus (P), Arsenic (As), or silicon (Si) and may be provided as a fluorine-containing gas, such as boron trifluoride ($BF_3$), germanium tetrafluoride ($GeF_4$), phosphorous trifluoride ($PF_3$), or silicon tetrafluoride ($SiF_4$). Other various dopant gases and/or dopant elements may also be utilized, such as inert gases, including argon (Ar), xenon (Xe), etc.

A common cause of ion source failure is that some materials accumulate on cathode surfaces during extended use of the ion implanter system 100. The accumulated materials tend to reduce a thermionic emission rate of source ions from cathode surfaces. Consequently, desired beam currents cannot be obtained and the ion source 102 may have to be replaced in order to maintain proper operation of the ion implanter system 100. In addition, if the deposits are conductive, they may result in a short between the cathode 208 and the source chamber 206 whereby no plasma may be generated in the source 102 and the source needs to be replaced or rebuilt. Furthermore, this change in the condition of the cathode 208, the repeller electrode 210, or extraction electrodes 240 may result in unstable output of ions from the source 102 which is highly undesirable. This may result in beam current drifts and, in some cases, a higher frequency of glitches, both of which may be critical metrics towards the performance of an ion source. As a result, performance degradation and short lifetime of the ion source 102 greatly reduces the productivity of the ion implanter system 100.

The above-described problems are especially significant for, but are not limited to, germanium ion implantation. Germanium ion implantation has been widely used in the semiconductor industry to pre-amorphize silicon wafers in order to prevent channeling effects. The demand for pre-amorphizing germanium ion implantation is expected to increase greatly in future semiconductor device manufacturing. One of the most popular source gases for germanium ion beams is germanium tetrafluoride ($GeF_4$) due to its stable chemical properties and cost-effectiveness. However, very short lifetimes of ion sources have been observed while operating with $GeF_4$ dopant gas.

The short lifetime of an ion source used in germanium ion implantation may be attributed to the presence of excessive, free fluorine atoms in the arc chamber 206 as a result of chemical dissociation of $GeF_4$ molecules. Specifically, arc chamber housing 202 material may be etched away due to chemical reactions with these free fluorine atoms. The arc chamber housing 202 material may eventually be deposited on a surface of the cathode 208, resulting in the degradation of electron emissions from the surface of the cathode 208.

It should be appreciated that while problems with germanium ion implantation are discussed above, other fluorine-containing dopant gases, such as boron trifluoride ($BF_3$), phosphorous trifluoride ($PF_3$), and silicon tetrafluoride ($SiF_4$), may exhibit similar problems that adversely affect performance and lifetime of the ion source 102 as a result of such materials deposited on the cathode 208. Although an inert gas, such as argon, xenon, etc., may be used as a dopant gas, using inert gases, even though they do not contain fluorine, inevitably result in reduced beam currents. As a result, ion source operation, such as performance and lifetime, is still greatly reduced.

Another common cause of ion source failure is caused by stripping (or sputtering) of material from the cathode 208 during source operation. For example, metallic material (e.g., tungsten (W), molybdenum (Mo), etc.) from the cathode 208 is inclined to be removed due to the bombardment of ions from plasma 20 in the arc chamber 206 accelerating towards the cathode 208. Because sputtering rate is dominated by the mass of the ion in the plasma 20, as ion mass increases, the sputtering effect may worsen. In fact, continued sputtering of material "thins" the cathode 208 and may eventually lead to an aperture or opening within the cathode 208. Consequently, performance and lifetime of the ion source 102 are greatly reduced when utilizing a dopant gas containing a heavy element, such as germanium (Ge), arsenic (As), xenon (Xe), indium (In), Antimony (Sb), etc., as opposed to lighter elements, such as boron (B) or carbon (C). These adverse effects are particularly noticeable when using hydrides (e.g., $AsH_3$, $PH_3$, $CH_4$, etc.), inert gases (Ar, Xe, etc.), or a mixture thereof, as the source material of desired implantation species.

In view of the foregoing, it would be desirable to provide a technique for improving the performance and extending the lifetime of an ion source to overcome the above-described inadequacies and shortcomings.

SUMMARY OF THE DISCLOSURE

Techniques for improving the performance and extending the lifetime of an ion source with gas mixing are disclosed. In one particular exemplary embodiment, the techniques may be realized as a method for improving performance and extending lifetime of an ion source in an ion implanter. The method may comprise releasing a predetermined amount of dopant gas into an ion source chamber. The dopant gas may comprise a dopant species. The method may also comprise releasing a predetermined amount of diluent gas into the ion source chamber. The diluent gas may dilute the dopant gas to improve the performance and extend the lifetime of the ion source.

In accordance with other aspects of this particular exemplary embodiment, the dopant gas may comprise a halogen-containing gas and the diluent gas may comprise at least one of a hydrogen-containing gas and an inert gas.

In accordance with further aspects of this particular exemplary embodiment, the dopant gas may comprise a hydrogen-containing gas and the diluent gas may comprise at least one of a halogen-containing gas and an inert gas.

In accordance with additional aspects of this particular exemplary embodiment, the method may further comprise releasing a predetermined amount of a second diluent gas into the ion source chamber, wherein the second diluent gas comprises at least one of a halogen-containing gas, a hydrogen-containing gas, and an inert gas.

In accordance with further aspects of this particular exemplary embodiment, the diluent gas may comprise a co-species.

In accordance with additional aspects of this particular exemplary embodiment, the diluent gas may complement the dopant gas and the dopant species may be the same as the co-species.

In accordance with further aspects of this particular exemplary embodiment, the dopant species may be different from the co-species.

In accordance with another exemplary embodiment, the techniques may be realized as an apparatus for improving performance and extending lifetime of an ion source in an ion implanter. The apparatus may comprise a dopant gas controller for releasing a predetermined amount of dopant gas from a dopant gas source into an ion source chamber. The dopant gas may comprise a dopant species. The apparatus may also comprise a first diluent gas controller for releasing a predetermined amount of a first diluent gas from a first diluent gas source into the ion source chamber. The first diluent gas may dilute the dopant gas to improve the performance and extend the lifetime of the ion source.

In accordance with another exemplary embodiment, the techniques may be realized an apparatus for improving performance and extending lifetime of an ion source in an ion implanter. The system may comprise an ion source have a dopant gas controller to release a predetermined amount of dopant gas from a dopant gas source into an ion source chamber. The dopant gas may comprise a dopant species. The system may also comprise one or more diluent gas controllers to release a predetermined amount of one or more diluent gases from one or more diluent gas sources into the ion source chamber. The one or more diluent gases may comprise one or more co-species. The dopant gas and the one or more diluent gases may form a complementary mixture to improve the performance and extend the lifetime of the ion source.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure improve the performance and extend the lifetime of an ion source with gas mixing.

Figure 1:
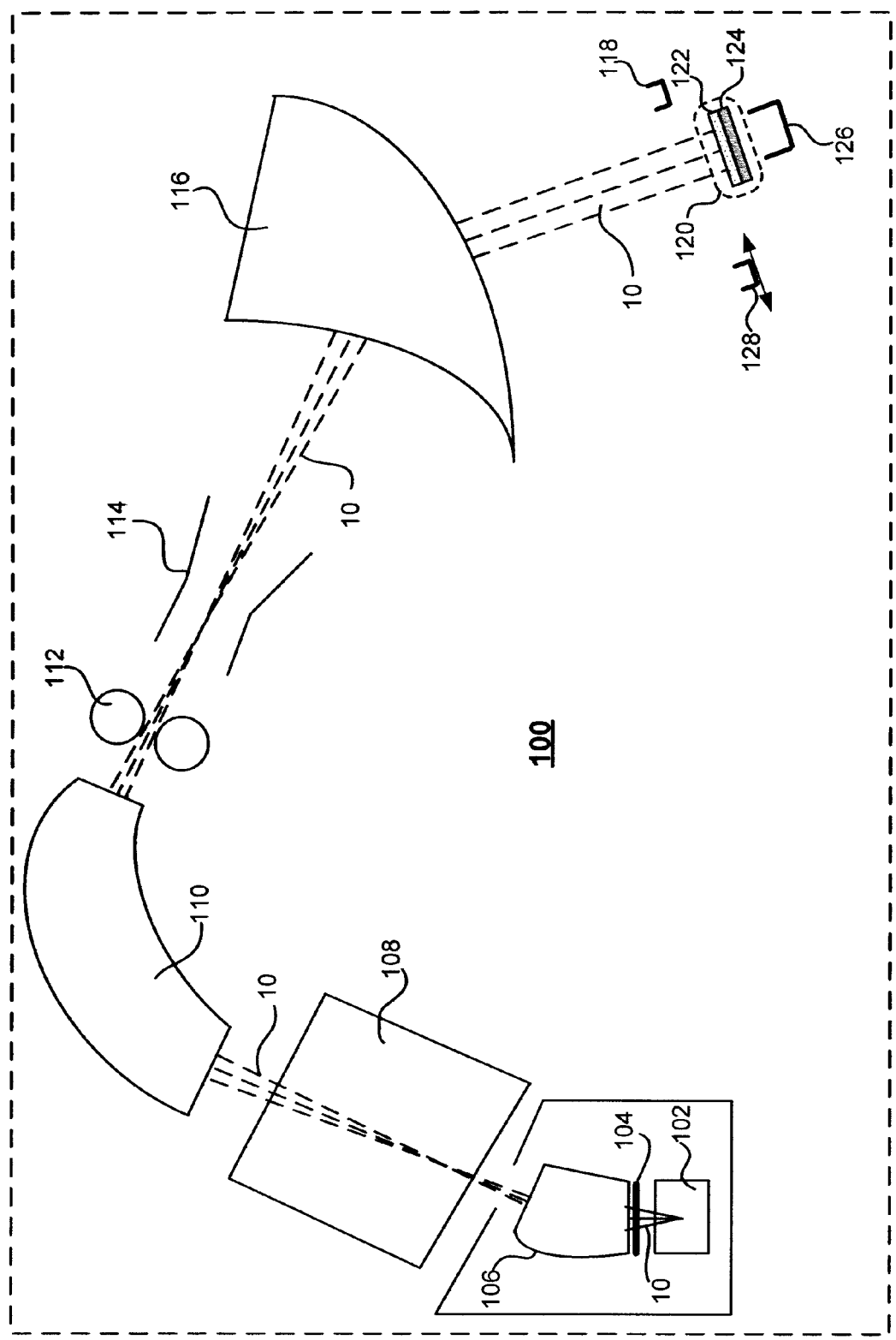
FIG. 1 depicts a conventional ion implanter system.
Figure 2:
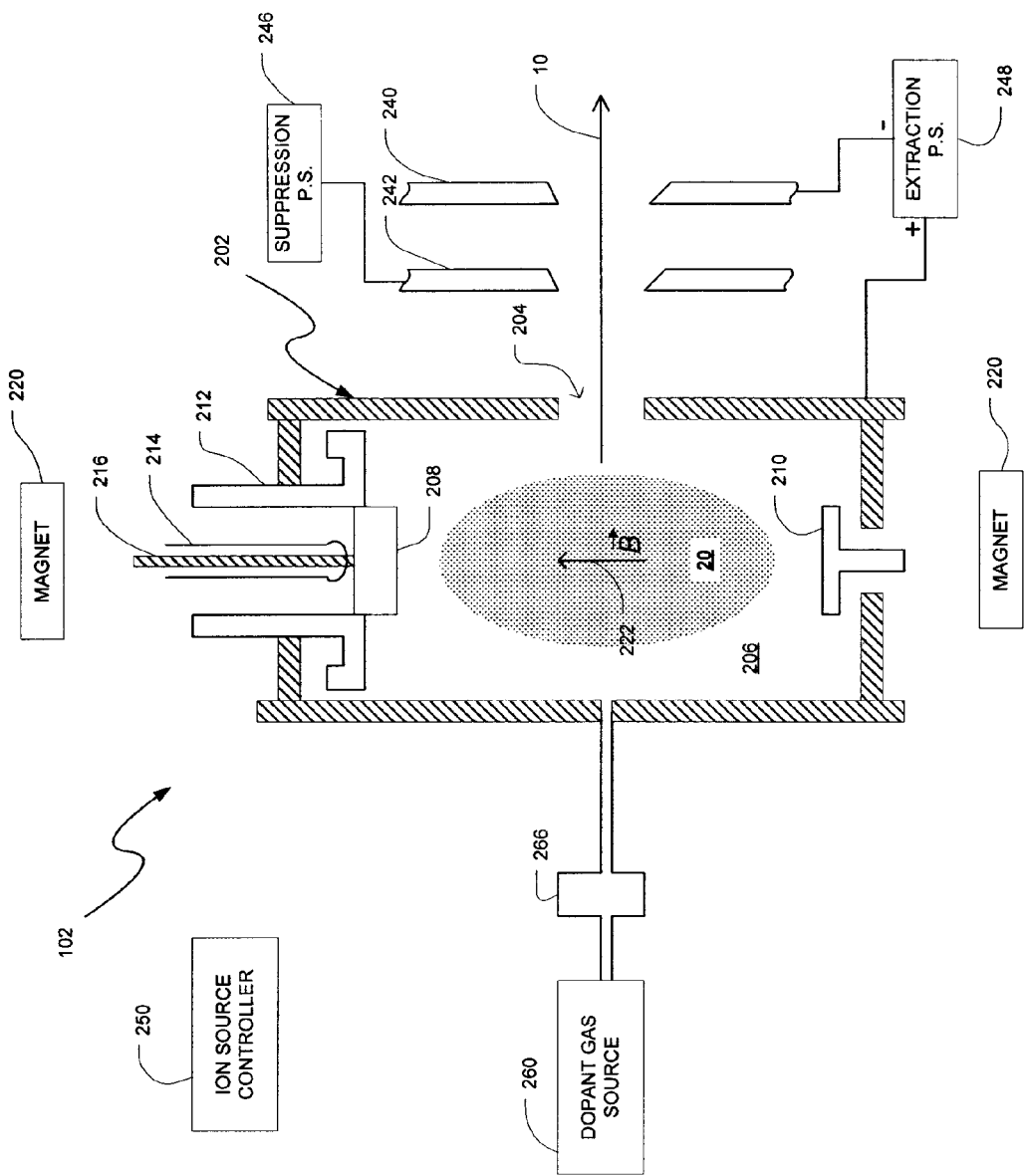
FIG. 2 depicts a conventional ion source in the conventional ion implanter system of FIG. 1.
Figure 3A:
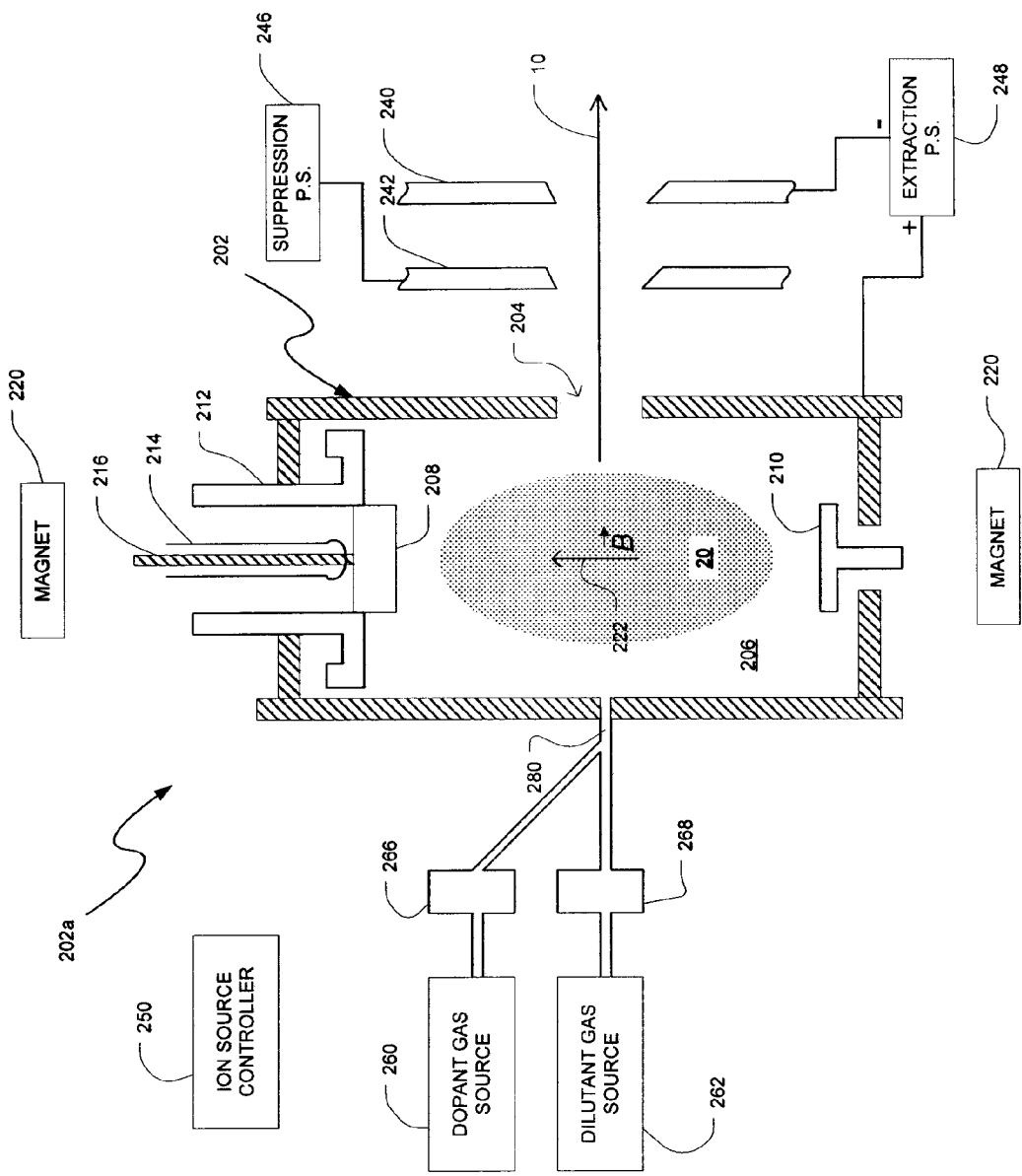
FIG. 3A depicts an exemplary ion source configuration in accordance with an embodiment of the present disclosure.
Figure 3B:
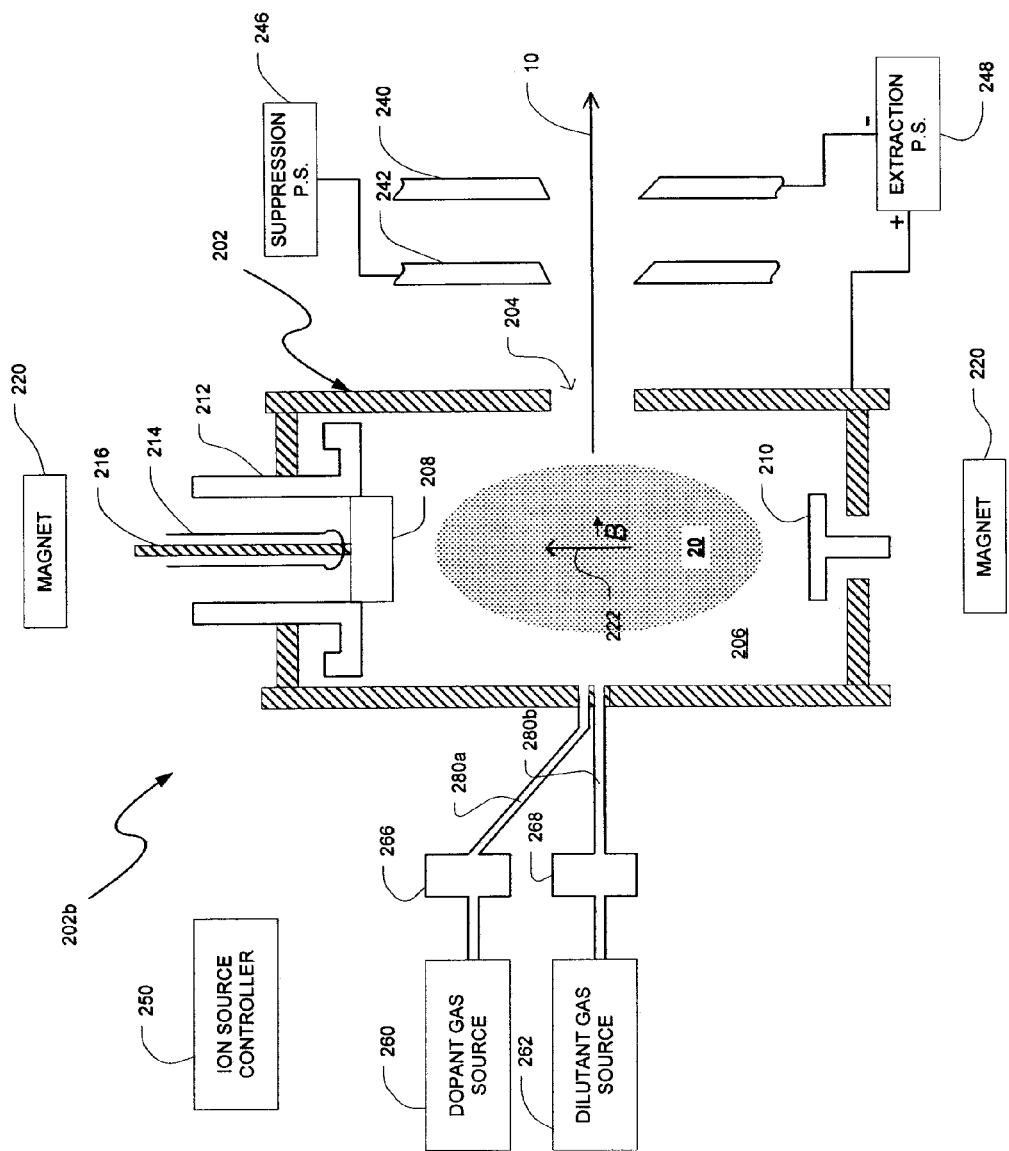
FIG. 3B depicts another exemplary ion source configuration in accordance with an embodiment of the present disclosure.
Figure 3C:
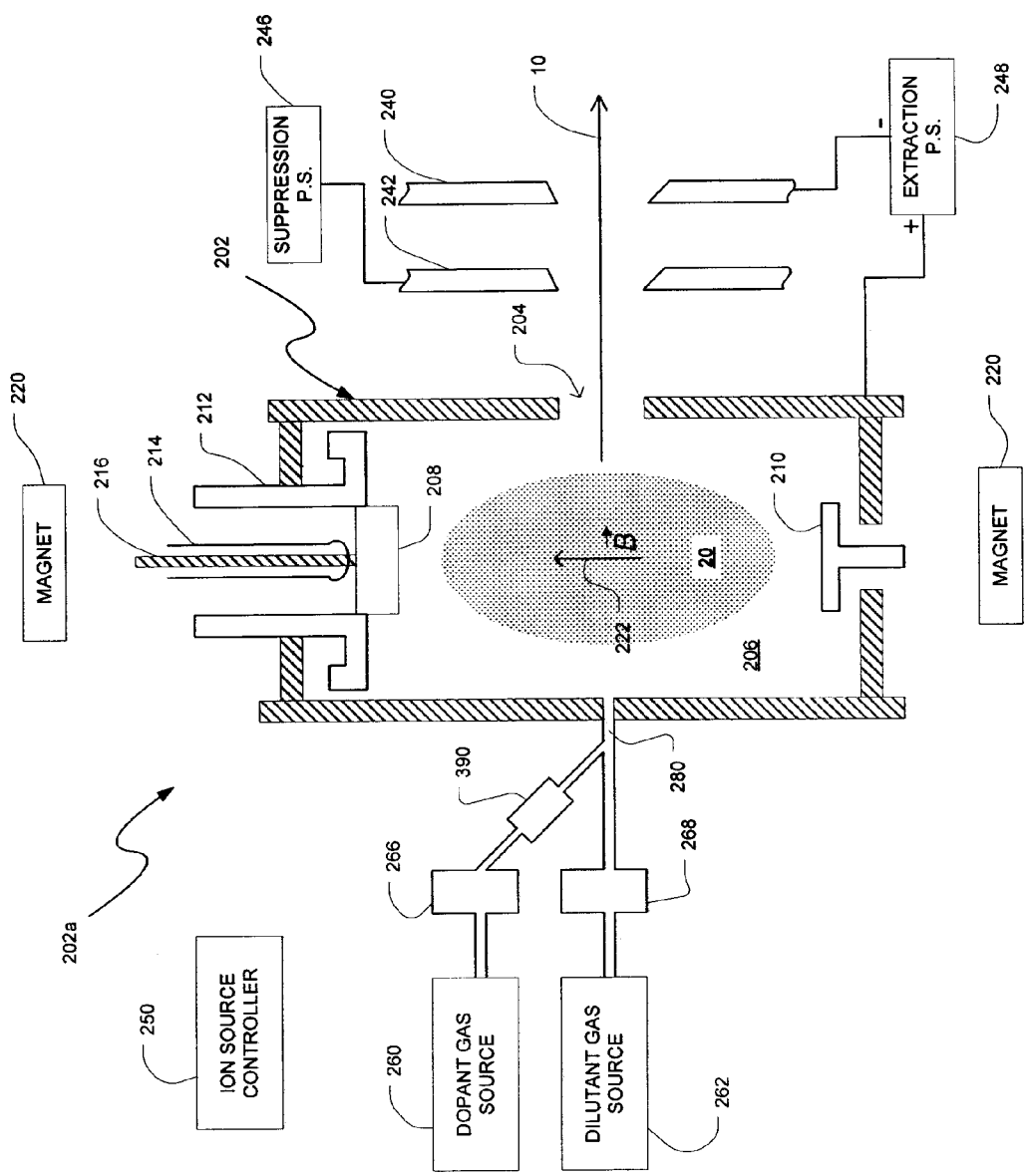
FIG. 3C depicts yet another exemplary ion source configuration in accordance with an embodiment of the present disclosure.

FIGS. 3A-3C depict exemplary ion source configurations 202a and 202b, respectively, in accordance with embodiments of the present disclosure. It should be appreciated by one skilled in the art that all of the elements of FIG. 2 are incorporated into FIGS. 3A-3C. As a result, most of the elements in FIGS. 3A-3C should be understood in relation to the elements in FIG. 2.

Referring to FIG. 3A, an ion source 202a may comprise one or more diluent gas sources to release one or more diluent gases into the arc chamber 206 to dilute a dopant gas from the dopant gas source 260. For example, a diluent gas source 262 and an associated gas flow controller 268 may provide a predetermined amount of diluent gas to the arc chamber 206 via a conduit 280 to dilute a dopant gas from the dopant gas source 260.

In one embodiment, as depicted in FIG. 3A, the dopant gas and the one or more diluent gases may be provided via the same conduit 280 into the arc chamber 206. Thus, the one or more diluent gases may be pre-mixed with the dopant gas in the conduit 280 before entering the arc chamber 206. In another embodiment, as depicted in FIG. 3B, the dopant gas and the one or more diluent gases in ion source 202b may be provided via different conduits 280a, 280b to the arc chamber 206. In such a case, the one or more diluent gases are mixed with the dopant gas in the arc chamber 206.

The dopant gas may include a variety of dopant species (e.g., germanium (Ge), boron (B), phosphorus (P), silicon (Si), arsenic (As), etc.), depending on the desired ion implant. In one embodiment, the dopant gas may be released from the dopant gas source 260 in the form of a halogen-containing gas. In another embodiment, the dopant gas may be released from the dopant gas source 260 in the form of a hydride (or hydrogen-containing) gas. For example, Table 1 illustrates one or more hydride gases and one or more halogenated gases for each of several dopant species.

TABLE 1

Implant Species in Hydride and Halogenated Form

| DOPANT SPECIES | HYDRIDE | HALOGENATED |
| --- | --- | --- |
| As | $AsH_3$ | $AsF_5, AsCl_3$ |
| B | $B_2H_6, B_{10}H_{18}$ | $BF^3, BI_3, BCl_3$ |
| P | $PH_3$ | $PF_3, PCl_3, PF_5$ |
| Ge | $GeH_4$ | $GeF_4$ |
| Si | $SiH_4, Si_2H_6$ | $SiF_4, SiCl_4, HSiCl_3$ |
| C | $CH_4, C_2H_2, CO_2, C_nH_{2n+2}$ | $CF_4, C_2F_6, CCl_4$ |
| In | In(Solid) | $InCl_3$ |
| (Any) | $H_2$ | $F_2, Cl_2$ |
| Gd | — | $GdCl_3$ |

In another embodiment, the dopant gas may also include an inert gas, such as argon (Ar) or an argon-containing gas, xenon (Xe) or a xenon-containing gas, etc. Other combinations and various dopant gases may also be considered.

Alternatively, in another embodiment, as depicted in FIG. 3C, a gas component 390, which may include a heater (not shown), to evaporate a dopant precursor and carry the dopant precursor (in vapor form) to the arc chamber 202 via the conduit 280a. In one embodiment, the gas component 390 may be a vaporizer. In this case, the heater may heat, for example, a solid source within the vaporizer to evaporate the dopant precursor. In another embodiment, the gas component 390 may be a bubbler. In this example, the heater may heat, for example, a liquid source, within the bubbler to evaporate the dopant gas. Additionally, a bubbler may also include a carrier gas to help carry the dopant vapors to the arc chamber 202 via the conduit 280a. In yet another embodiment, the gas component may also use elemental form of the dopant species itself, e.g., phosphorus, metals, etc. and carry these vapors to the arc chamber 202 via the conduit 280a. Other various embodiments may also be provided.

According to one embodiment of the present disclosure, the diluent gas may include hydrogen ($H_2$) or a hydrogen-containing gas. In another embodiment, the diluent gas may include a halogen or halogen-containing gas (e.g., $F_2$, $Cl_2$, etc.) Other combinations and various diluent gases may also be utilized.

Referring back to FIG. 3A, when the filament 214 is heated by an associated power supply to thermionic emission temperatures, electrons emitted from the filament 214 are accelerated into the cathode 208 due to a positive bias on the cathode relative to the filament (not shown) to thereby heat the cathode 208 to thermionic emission temperatures. Electrons emitted by the cathode 208 may then be accelerated away from the cathode due to the negative arc voltage relative to the arc chamber and may ionize gas molecules of the dopant gas provided by the dopant gas source 260 within the arc chamber 206 to produce the plasma 20. The electrons within the arc chamber 206 may follow spiral trajectories due to the magnetic field B 222 to increase the number of ionizing collisions. The repeller electrode 210 builds up a negative charge to repel electrons back through the arc chamber 206 producing additional ionizing collisions. In one embodiment, the repeller electrode 210 may be biased independently using its own power supply or the same power supply as the cathode 208 to ensure that electrons are confined between the cathode 208 and the repeller 210 for efficient ionization of atoms. The lifetime of the ion source 202a when using halogen-containing (e.g., fluorine-containing) dopant gases, such as $BF_3$, $GeF_4$, $PF_3$, and $SiF_4$, may be limited by metallic growth (e.g., tungsten (W) deposits) on arc chamber components exposed to the plasma 20. These components may include the cathode 208 and the repeller 210. Specifically, the tungsten from the arc chamber walls, for example, may combine with fluorine to form $WF_6$, which stays in a gas form unless exposed to a temperature higher than the arc chamber housing walls and a temperature lower than the extraction aperture 204, cathode 208, and repeller 210. As a result, $WF_6$ molecules decomposing on the hottest surfaces may lead to tungsten buildup on such surfaces. Such tungsten buildup on the hot surfaces may be determined by the amount of tungsten removed from the arc chamber walls through reactions of fluorine (F) radicals in the plasma 20. As a result, the rate of tungsten removal from the arc chamber walls may therefore be a function of the concentration of free fluorine radicals in the plasma 20. Therefore, controlling the concentration of free fluorine radicals in the plasma 20 may regulate the rate of tungsten buildup on the cathode 208 and the repeller 210. Thus, by releasing a predetermined amount of one or more diluent gases, such as a hydrogen-containing diluent gas (or inert gas), along with a predetermined amount of dopant gas into the arc chamber 206, the rate of metallic growth or tungsten build-up may be diminished.

Addition of inert diluent may reduce the concentration of fluorine radicals in the plasma 20 for oxidizing (or removing) the tungsten (or other metal) from the arc chamber walls. Hydrogen radicals generated from the hydrogen-containing diluent gas may additionally scavenge excessive, free fluorine molecules in the arc chamber 206 to reduce the formation of $WF_6$ (or other volatile metal halide, depending on the material of construction of the chamber walls). As a result, the release of one or more hydrogen atoms, hydrogen-containing diluent gases mixed with the dopant gas may improve the performance and extend the lifetime of ion sources.

It should be appreciated that the one or more diluent gases may also reduce tungsten buildup when the dopant gas is a non-fluorine, halogen-containing dopant gas. Accordingly, adding the one or more diluent gases to dilute such dopant gases may also lead to improved performance and extended lifetime for ion sources. Such diluent gases may include, for example, an inert gas or a hydrogen-containing gas as described above.

There are several advantages for using one or more diluent gases, such as hydrogen or a hydrogen-containing gas. First, hydrogen or a hydrogen-containing gas may be more readily accessible when compared to other diluent gases. This may lead to a more cost-effective approach for improving ion source performance and extending ion source lifetime. Additionally, diluent gas sources containing hydrogen or a hydrogen-containing gas may be relatively easy to incorporate in many ion source configurations. As a result, using hydrogen or hydrogen-containing diluent gases may also provide a simple approach for improving the performance and extending the lifetime of an ion source.

However, one problem that may be encountered when using diluent gases, particularly hydrogen-containing diluent gases, includes reduced ion beam current. A reduction in ion beam current may occur when a dopant gas having a dopant species is mixed with a hydrogen-containing diluent gas having a co-species that is different from the dopant species. For example, when a hydrogen-containing diluent gas, such as $AsH_3$, is mixed with a $GeF_4$ dopant gas, the advantageous effects of free hydrogen combining with free fluorine molecules may continue to extend ion source lifetime. However, the ion beam current for the desired dopant species (in this case, Ge) may be reduced due to the lack of any dopant (Ge) in the co-species in the plasma 20. As a result, the ion beam current for implanting Ge may be reduced when using a hydrogen-containing diluent gas having a co-species that is different than the species of the dopant gas.

In accordance with another embodiment of the present disclosure, the reduction in ion beam current may be prevented by using a complementary combination (or mix) of dopant-diluent gases during ion implantation. Additionally, retention of all the desired ion source lifetime advantages may still be achieved when using a diluent gas that complements the dopant gas. For example, a $GeF_4$ dopant gas may contain a particularly desired Ge dopant species. However, introducing one or more hydrogen-containing gases having a co-species that is different from the species in the dopant gas may significantly reduce ion beam current. Therefore, in one embodiment, a predetermined amount of complementary diluent gas having a Ge co-species may be mixed with a $GeF_4$ dopant gas having a Ge species to prevent the reduction of Ge ion beam current. Referring to Table 1, for example, a $GeH_4$ diluent gas may be complementary diluent gas for a $GeF_4$ dopant gas. In this example, the $GeH_4$ diluent gas and the $GeF_4$ dopant gas have the same species of interest, which in this case is Ge. As a result, once the gases are mixed, not only do the free hydrogen and the free fluorine combine to improve the lifetime of the ion source, the presence of the Ge species from both the dopant gas and the diluent gas may prevent any loss in ion beam current.

It should be appreciated that while $GeF_4$ and $GeH_4$ are discussed as being one complementary combination of dopant-diluent gases, a variety of other combinations may also be utilized. In one embodiment, as depicted in Table 1, any halogenated dopant gas of a particular dopant species may be complemented or mixed with any hydride diluent gas having a co-species that is the same as the dopant species. In another embodiment, the dopant gas may be in hydride form and the one or more diluent gases may be in halogenated form. For example, $GeH_4$ may be the dopant gas and $GeF_4$ may be the diluent gas. This may also form a complementary dopant-diluent mixture. In yet another embodiment, hydrogen gas ($H_2$) may be released as an additional diluent gas with any dopant-diluent mixture for extending ion source lifetime without reducing ion beam current. Depending on the complementary dopant-diluent combination that is mixed, concentrations and quantities of each of the dopant and one or more diluent gases may vary. Other various mixtures and combinations may also be considered.

It should be appreciated that while only one diluent gas is described with reference to FIGS. 3A-3B, a greater number of diluent gases, diluent gas sources, and diluent gas flow controllers may be implemented.

The choice of gas mixtures to improve stability and lifetime of an ion source may be achieved using the techniques described above. Chemically balancing and/or controlling the concentration of reactive species in the plasma 20 through the use of optimizing complementary dopant-diluent gases may provide improved ion source operation. Although the advantages of using a dopant gas having the same species as that of a diluent gas are disclosed above, it should be appreciated that co-species with different electronegativities may also be used to balance the net concentrations of etching and/or depositing effects in the plasma 20. Other various combinations and mixtures of dopant and diluent gases may also be utilized.

It should be appreciated that while embodiments of the present disclosure are directed to introducing one or more diluent gases for improving performance and extending lifetime of ion sources in specific ion implanter systems, other implementations may be provided as well. For example, a technique for introducing one or more diluent gases may apply to a variety of other types of ion sources, such as Bernas, Freeman, inductively heated cathode (IHC), or derivatives thereof, or plasma-based ion implantation systems, such as glow discharge plasma doping (GD-PLAD) or radio frequency plasma doping (RF-PLAD) systems. Other various implementations may also be provided.

In addition to improving performance and extending lifetime of ion sources in ion implanter systems, the presently disclosed techniques for using one or more diluent gases during ion implantation may have further advantages. For example, greater efficiency in the use of an ion source may be achieved because excessive time and costs due to ineffective, inefficient, and redundant steps associated with traditional ion implantation techniques may be reduced and/or eliminated using the improved diluent gas techniques of the present disclosure. Thus, embodiments of the present disclosure may provide improved operation, such as enhanced performance and extended lifetime, of an ion source in ion implanter systems using gas mixing to expand the application of traditional ion implantation methods and systems.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method for improving performance and extending lifetime of an ion source in an ion implanter, the method comprising:

introducing a predetermined amount of dopant gas into an ion source chamber, wherein the dopant gas comprises a first co-species and a dopant species; and introducing a predetermined amount of diluent gas into the ion source chamber, wherein the diluent gas dilutes the dopant gas to improve the performance and extend the lifetime of the ion source, wherein the diluent gas comprises a second co-species and the dopant species.

2. The method of claim 1, wherein the dopant gas is a halogen-containing gas and the diluent gas is a hydrogen-containing gas.

3. The method of claim 1, wherein the dopant gas is a hydrogen-containing gas and the diluent gas is a halogen-containing gas.

4. The method of claim 1, wherein the method further comprises releasing a predetermined amount of a second diluent gas into the ion source chamber.

5. The method of claim 4, wherein the second diluent gas comprises at least one of a halogen-containing gas, a hydrogen-containing gas, and an inert gas.

6. The method of claim 4, wherein the second diluent gas comprises at least one of an additional dopant gas, an additional diluent gas, a halogen gas, hydrogen gas, and an inert gas.

7. The method of claim 1, wherein the dopant species is different from the first and second co-species.

8. The method of claim 1, wherein the dopant gas comprises a hydride of the dopant species and the diluent gas comprises a halide of the same dopant species.

9. The method of claim 1, wherein the dopant gas comprises a halide of the dopant species and the diluent gas comprises a hydride of the same dopant species.

10. An apparatus for improving performance and extending lifetime of an ion source in an ion implanter, the apparatus comprising:

a dopant gas controller for releasing a predetermined amount of dopant gas from a dopant gas source into an ion source chamber, wherein the dopant gas comprises a first co-species and a dopant species; and a first diluent gas controller for releasing a predetermined amount of a first diluent gas from a first diluent gas source into the ion source chamber, wherein the first diluent gas dilutes the dopant gas to improve the performance and extend the lifetime of the ion source, wherein the diluent gas comprises a second co-species and the dopant species.

11. The apparatus of claim 10, wherein the dopant gas is a halogen-containing gas and the diluent gas is a hydrogen-containing gas.

12. The apparatus of claim 10, wherein the dopant gas is a hydrogen-containing gas and the diluent gas is a halogen-containing gas.

13. The apparatus of claim 10, wherein the method further comprises releasing a predetermined amount of a second diluent gas into the ion source chamber.

14. The apparatus of claim 13, wherein the second diluent gas comprises at least one of a halogen-containing gas, a hydrogen-containing gas, and an inert gas.

15. The apparatus of claim 13, wherein the second diluent gas comprises at least one of an additional dopant gas, an additional diluent gas, a halogen gas, hydrogen gas, and an inert gas.

16. The apparatus of claim 10, wherein the diluent gas comprises a co-species.

17. The apparatus of claim 16, wherein the dopant species is the same as the co-species.

18. The apparatus of claim 16, wherein the dopant species is different from the co-species.

19. The apparatus of claim 1, wherein the dopant gas comprises a hydride of the dopant species and the diluent gas comprises a halide of the same dopant species.

20. The apparatus of claim 1, wherein the dopant gas comprises a halide of the dopant species and the diluent gas comprises a hydride of the same dopant species.

21. A system for improving performance and extending lifetime of an ion source in an ion implanter, the system comprising:

an ion source comprising a dopant gas controller, one or more diluent gas controllers, and an ion source chamber;

wherein the dopant gas controller releases a predetermined amount of dopant gas from a dopant gas source into the ion source chamber, wherein the dopant gas comprises a first co-species and a dopant species;

wherein the one or more diluent gas controllers release a predetermined amount of one or more diluent gases from one or more diluent gas sources into the ion source chamber, wherein the one or more diluent gases comprise one or more co-species and the dopant species; and wherein the dopant gas and the one or more diluent gases form a complementary mixture to improve the performance and extend the lifetime of the ion source.

22. The system of claim 17, wherein the dopant species is the same as the at least one of the one or more co-species.

23. The system of claim 17, wherein the one or more diluent gases comprise at least one of a halogen-containing gas and a hydrogen-containing gas.

* * * * *